United States Patent

Shute et al.

(10) Patent No.: US 8,315,581 B2
(45) Date of Patent: Nov. 20, 2012

(54) TRANSMITTER WITH HYBRID CLOSED LOOP POWER CONTROL

(75) Inventors: Nick Shute, Munich (DE); Michael Wilhelm, Furstenfeldbruck (DE); Andrea Camuffo, Munich (DE); Alexander Belitzer, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 803 days.

(21) Appl. No.: 12/233,360

(22) Filed: Sep. 18, 2008

(65) Prior Publication Data

US 2010/0069026 A1 Mar. 18, 2010

(51) Int. Cl.
*H04B 1/04* (2006.01)

(52) U.S. Cl. .......... 455/127.3; 455/126; 455/127.1; 455/522; 330/282

(58) Field of Classification Search ......... 455/127.3, 455/126, 127.1, 522
See application file for complete search history.

(56) References Cited

U.S. PATENT DOCUMENTS

| | | | |
|---|---|---|---|
| 6,788,138 B2 * | 9/2004 | Suzuki | 330/129 |
| 6,819,938 B2 * | 11/2004 | Sahota | 455/522 |
| 6,868,270 B2 * | 3/2005 | Dent | 455/435.1 |
| 6,868,279 B2 * | 3/2005 | Sahlman et al. | 455/522 |
| 7,071,776 B2 * | 7/2006 | Forrester et al. | 330/129 |
| 7,483,678 B2 * | 1/2009 | Rozenblit et al. | 455/73 |
| 7,539,462 B2 * | 5/2009 | Peckham et al. | 455/83 |
| 7,593,707 B2 * | 9/2009 | Ibrahim et al. | 455/260 |
| 7,756,491 B2 * | 7/2010 | Kee et al. | 455/114.3 |
| 2001/0006888 A1 | 7/2001 | Posti et al. | |
| 2010/0008410 A1 * | 1/2010 | Shute et al. | 375/221 |
| 2010/0027596 A1 * | 2/2010 | Bellaouar et al. | 375/219 |

FOREIGN PATENT DOCUMENTS

| | | |
|---|---|---|
| DE | 10124179 A1 | 7/2002 |
| DE | 10163466 A1 | 7/2003 |
| DE | 69836071 | 3/2007 |
| GB | 2349522 A | 11/2000 |

* cited by examiner

*Primary Examiner* — Andrew Wendell
*Assistant Examiner* — Chung-Tien Yang
(74) *Attorney, Agent, or Firm* — Eschweiler & Associates, LLC

(57) ABSTRACT

Systems and method for implementing a transmitter with hybrid closed loop power control in a communication device.

20 Claims, 4 Drawing Sheets

TRANSMITTER WITH HYBRID CLOSED LOOP POWER CONTROL

BACKGROUND

Modern electronics and communication systems may require accurate output power control for effective transmission of data. A variable gain stage may be used to control output power. The variable gain stage can work in an open loop mode (i.e., without feedback), or a closed loop mode (i.e., with feedback). The variable gain stage may be implemented via Variable Gain Amplifiers (VGA) or Programmable Gain Amplifiers (PGA).

When a VGA controls the output power directly in open loop mode, factors pertaining to a control port of the VGA, such as slope linearity and step accuracy specifications, may prove critical during implementation. For example, the step accuracy and the slope linearity specifications of a control port of a VGA can be difficult to meet due to fine step requirements for accurate output power control. In certain implementations, a ramping signal may be provided for power change instead of a sharp step response.

Furthermore, a VGA generally implements an analog gain stage, which makes control port specifications difficult to implement. Furthermore, if the VGA is controlled in a closed loop mode, the control slope of the VGA varies, thereby varying the closed loop bandwidth and making the closed loop non-linear. Due to this, transient performance of the VGA may be affected and phase margin of the VGA may be reduced. An additional issue with closed loop systems is that there is a trade off between speed of locking and accuracy of step.

In certain systems, to control the output power, slope characteristics of a VGA may be controlled either by tight analog design specifications or by gain control linearization techniques. Tight analog design specifications may require complex circuitry, which can be cost intensive or current consuming. Gain control linearization techniques may involve the use of additional compensation circuitry or use of digital linearization techniques such as a look-up table which may require additional die area and current consumption. In addition, certain systems may control gain step accuracy of the VGA by precision control of currents or voltages, which also may be a function of circuit complexity.

Circuit complexities in the design of a VGA could demand additional circuit design efforts and increased current consumption. Furthermore, all of the above mentioned techniques are typically valid for a single temperature and supply voltage range due to analog VGA circuitry. Therefore, additional compensation circuitry may also be required across various operational variations.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

The disclosed subject matter relates to a transmitter with hybrid closed loop power control in a communication device. In particular, described are techniques for controlling the output power of a signal transmitted through the communication device. The disclosed circuit(s) can be implemented in a variety of electronic or communication devices that require a consistent output power control. Devices that can benefit from the circuit include, but are not limited to, CMOS fabricated mobile phone transmitters compatible to 3GPP (3rd generation partnership project) standards like GSM or UMTS. The following systems and methods are described with reference to a mobile communication system; however, it will be appreciated that the disclosed techniques and circuits can be implemented generally in any similar electronic/communication systems.

A transmitter in a mobile communication system, such as a cell phone, receives an input signal and modulates the input signal into an RF signal. The output power of the RF signal is controlled per pre-specified requirements. The output power can be controlled during an open loop mode of the transmitter by varying the gain of a variable gain amplifier (VGA) directly to scale up or scale down the output power. In addition, the output power also may be controlled during a closed loop mode, where the transmitter output power can be detected and fed back to the loop controller for comparison with a reference target signal, from which a fine gain adjustment signal can be generated.

In the proposed circuitry, the output power of a signal transmitted through the communication device is controlled in both the open loop and the closed loop modes. In the open loop mode of control, the output power of the input signal is controlled directly by adjusting the gain of the VGA. Usually, gain control via the open loop mode control is coarse and therefore either needs significant calibration or needs further refinement for accurate transmitter power control. For fine gain control, the closed loop mode of control is employed. In the closed loop mode of control, the output signal is fed back to the loop controller and is processed in digital domain. In the digital domain, a feedback signal is subtracted from a reference signal to generate an error signal. The error signal is then processed and sent to a gain block in order to provide accurate power control. Controlling the output power in the digital domain in the closed loop mode ensures fine gain step accuracy.

Exemplary Systems

Figure 1:
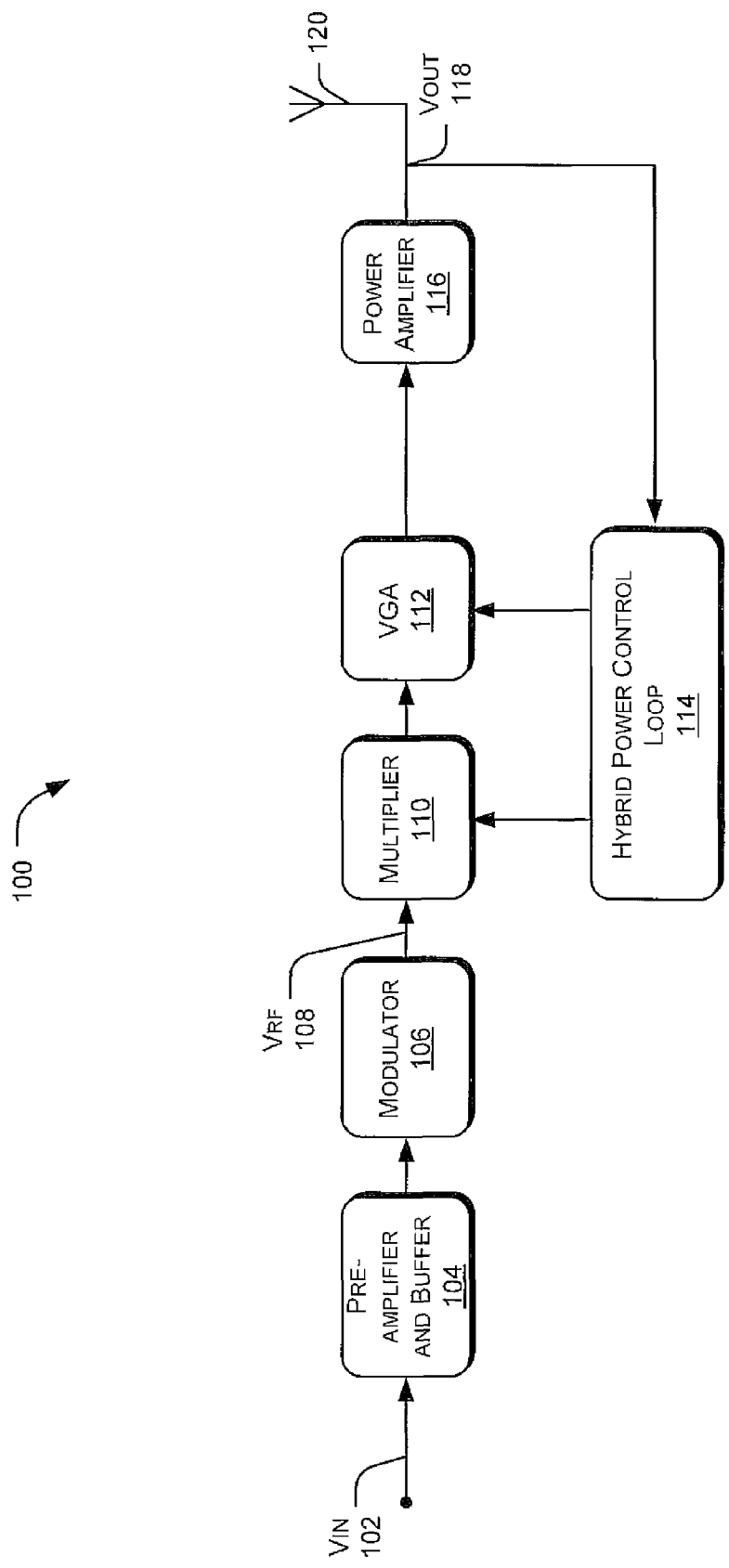
FIG. 1 is a block diagram of an exemplary transmitter with hybrid closed loop power control in a communication device.
Figure 2:
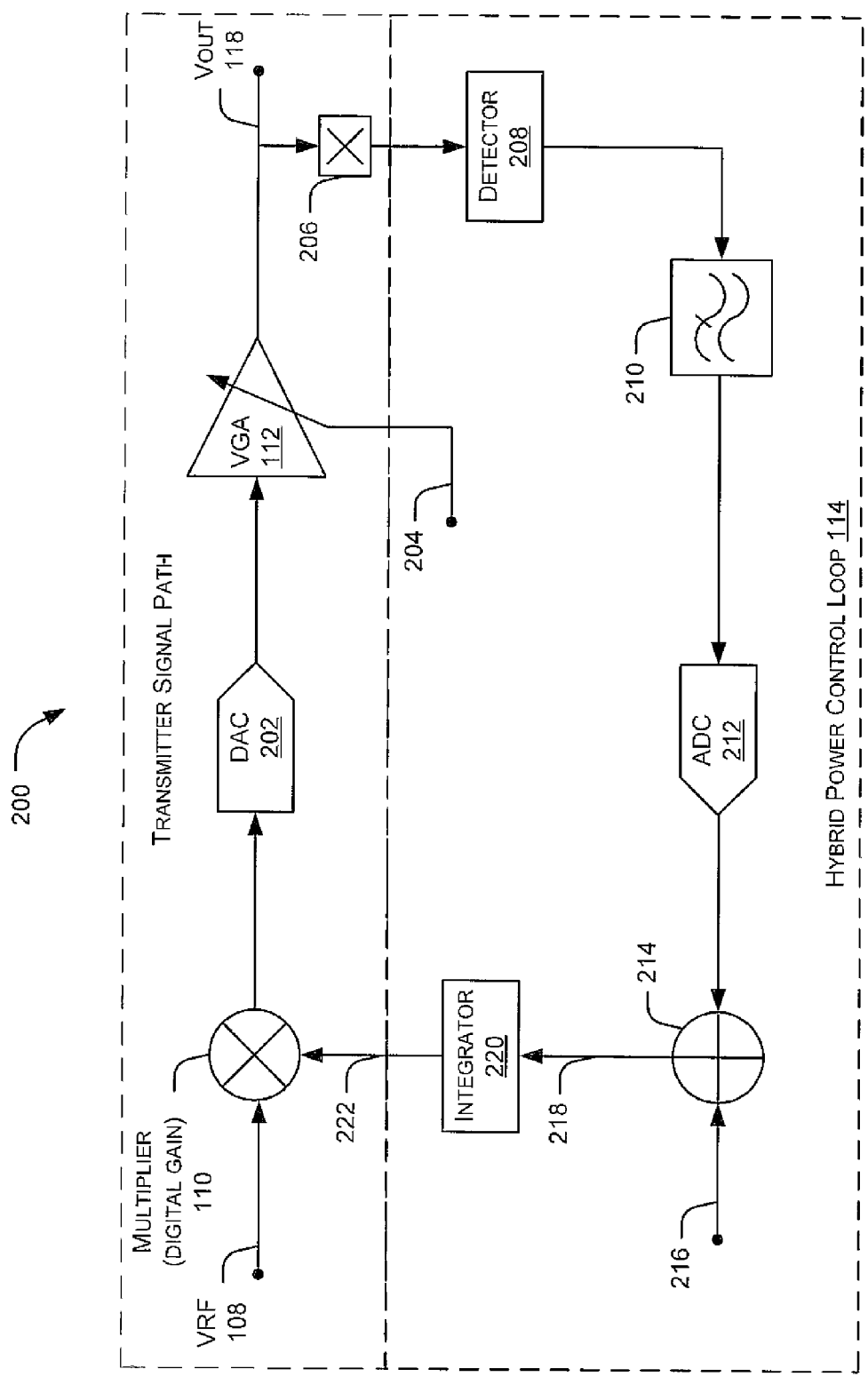
FIG. 2 is a circuit diagram of an exemplary transmitter with hybrid closed loop power control.
Figure 3:
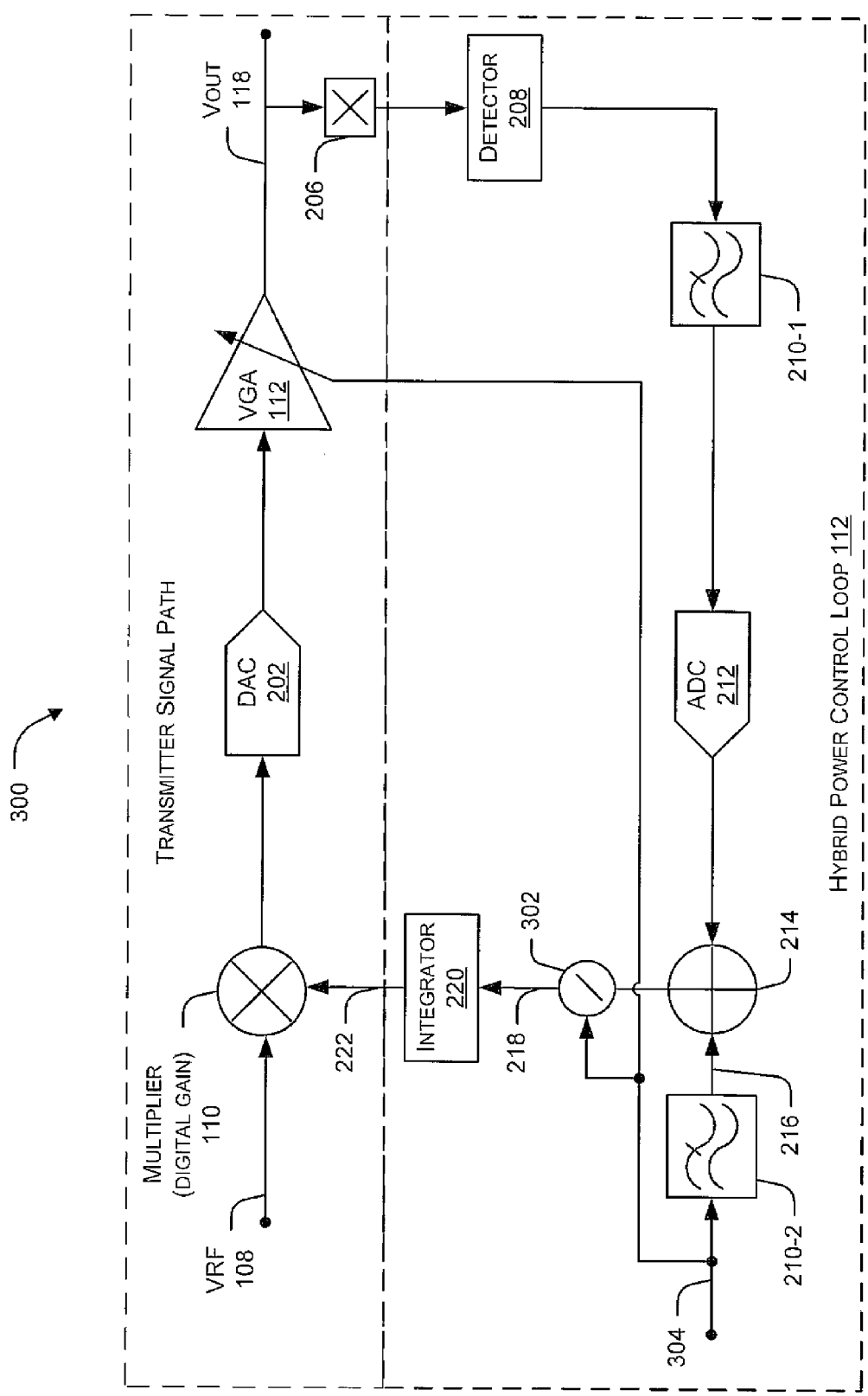
FIG. 3 is a circuit diagram of an exemplary transmitter with hybrid closed loop power control.

FIGS. 1-3 illustrate various exemplary block diagrams and circuit diagrams of a transmitter with hybrid closed loop power control in a communication device. The order in which the blocks of the system are described is not intended to be construed as a limitation, and any number of the described system blocks can be combined in any order to implement the system, or an alternate system. Additionally, individual blocks may be deleted from the system without departing from the spirit and scope of the subject matter described herein. Furthermore, the system can be implemented in any suitable hardware, software, firmware, or a combination thereof, without departing from the scope of the invention.

FIG. 1 illustrates an exemplary block diagram of a transmitter 100 with hybrid closed loop power control in a communication device. In one implementation, the transmitter 100 represents an RF (radio frequency) transmission section of a mobile communication device, such as a cell phone. The transmitter 100 receives an input signal $V_{IN}$ 102. The $V_{IN}$ signal 102 can be an analog baseband signal that may correspond to any signal or data including voice, text, or audio-video data. The $V_{IN}$ signal 102 is received at a pre-amplifier and buffer 104.

The pre-amplifier and buffer 104 amplifies $V_{IN}$ 102, making the $V_{IN}$ signal 102 suitable for further processing. For this purpose, the pre-amplifier and buffer 104 can provide a voltage gain to the $V_{IN}$ signal 102. The pre-amplifier and buffer 104 can also provide an electrical impedance transformation to the $V_{IN}$ signal 102 before any further processing of the signal 102. The amplified signal that is generated is sent to a modulator 106.

The modulator 106, which may be either an RF modulator or a digital modulator, converts the amplified signal into a high frequency-modulated signal $V_{RF}$ signal 108. $V_{RF}$ can either be a analog radio frequency signal or a high frequency digitally modulated signal. The modulator 106 conditions the amplified signal to be capable of being transmitted through free space. The output power of the $V_{RF}$ signal 108 can be controlled via a multiplying amplifier or multiplier 110 and a VGA 112.

The output power of the $V_{RF}$ signal 108 may be controlled per pre-specified requirements. Power control via the VGA 112 involves adjusting the gain of the multiplier 110 and the gain of the VGA 112 in accordance with a hybrid power control loop or HPCL 114. The HPCL 114 includes two points of gain control (i.e., the open loop control mode and the closed loop control mode).

In the open loop control mode, a coarse gain adjustment is made in the VGA 112 to control the output power of the $V_{RF}$ signal 108. Due to direct open loop control a fast transmitter power step can be achieved. In the closed loop control mode, a fine adjustment is made in the multiplier 110 by an integrated error signal to control the output power of the $V_{RF}$ signal 108. The closed loop control mode may operate in digital domain and therefore can regulate with fine gain accuracy, thereby removing any step error produced by the coarse open loop gain step of the VGA 112. Depending on the gain of the VGA 112, the output power of the $V_{RF}$ signal 108 can be scaled either up or down. This two point gain control mechanism can assure accurate and fast power control of the $V_{RF}$ signal 108 while minimizing design requirements on the analog VGA 112. The $V_{RF}$ signal 108 is fed to a power amplifier 116.

The power amplifier 116 amplifies and increases the power efficiency of the VRF signal 108, thus producing an output signal VOUT 118. To meet the pre-specified power requirements, the VOUT signal 118 can be fed back to the circuit, providing gain control via the HPCL 114, as described above. After amplification by the power amplifier 116, the VOUT signal 118 can be transmitted via an antenna 120.

FIG. 2 illustrates an exemplary circuit 200 of a transmitter with hybrid closed loop power control. The circuit 200 is intended to explain the concepts related to hybrid closed loop power control at an elementary level and the number of components shown in the figure does not limit the actual implementation of the circuit.

The circuit 200 receives the $V_{RF}$ signal 108 from the modulator 106, as described with reference to FIG. 1. The $V_{RF}$ signal 108 is multiplied with a digital gain signal at the multiplier 110. A digital output signal from the multiplier 110 is fed to a digital to analog converter, referred to as DAC 202, where the digital output signal is converted into an analog output signal. The analog output signal is fed to the VGA 112.

Output power of the analog output signal can be controlled directly by adjusting the gain of the VGA 112 via a reference value applied at an open loop control port 204. Due to the VGA 112 being an analog component, its control characteristic may be significantly non-linear. Therefore, regulating the output power in the open loop mode provides for coarse or inaccurate adjustment. The adjusted analog output signal or $V_{OUT}$ signal 118 is then fed back to the HPCL 114 (as identified by the dotted line) via a coupler 206.

The coupler 206 feeds back the $V_{OUT}$ signal 118 into the HPCL 114. The coupler 206 may be a directional coupler, which is used to feed a small amount of signal travelling in the forward direction and provides isolation in the reverse direction. A detector 208 detects the $V_{OUT}$ signal 118 obtained from the coupler 206.

The detector 208 may be a wideband detector, which detects an envelope of the VOUT signal 118. The detected signal is then filtered by a filter 210 to remove noise or unwanted components from the detected signal and obtain a filtered signal. In one implementation, the bandwidth of the filter 210 is lower than the bandwidth of the HPCL 114. The filtered signal is then fed to an analog to digital converter or ADC 212, for further processing.

The ADC 212 converts the filtered signal, which is an analog signal, to a digital signal. The ADC 212 can be any of various analog-to-digital converters known in the art. The digital signal from the ADC 212 is then fed to an input of a subtraction block 214.

At the subtraction block 214, the measured digital signal is compared with a target value applied as a target signal at a closed loop control port 216. In one implementation, the target signal applied at the closed loop control port 216 is equal to the reference value applied at the open loop control port 204. The subtraction block 214 generates an error signal 218 having a value equal to the difference in the value of the digital signal and the target value. The resulting error signal 218 is then fed to an integrator 220.

The integrator 220 integrates the error signal 218 and feeds an integrated signal 222 to the multiplier 110. The integrated signal 222 therefore acts as the digital feedback signal as discussed above. At the multiplier 110, the integrated signal 222 is multiplied with the VRF signal 108 to amplify the signal. The amplified modulated signal is then fed to the DAC 202 as discussed above. The DAC 202 converts the digital control signal into an analog control signal. The analog control signal provides for accurate gain adjustment in the VGA 112 and can provide for accurate power control of the output signal 118. It is to be noted that the HPCL 114 operates in the digital domain in the closed loop mode, and therefore can effectively regulate step inaccuracy errors caused due to the non-linearity of the VGA 112.

FIG. 3 illustrates another exemplary circuit 300 of the transmitter with hybrid closed loop power control in a communication device. The circuit 300 is an alternate implementation of the exemplary circuit 200 with a divider block 302 and a hybrid control port 304. The circuit 300 works in a similar manner as the circuit 200 and includes added features and components. In FIG. 3, the components common with FIG. 2 have been referred to by the same names and numerals.

In the circuit 200 as explained above, adjusting the gain of the VGA 112 in the open loop mode, while the circuit 200 is placed within the closed loop mode, can change the gain of the closed loop and can result in the reduction in closed loop phase margin. Therefore, the change in the gain of the HPCL 114 and the phase margin are directly proportional to a change in the open loop gain of the VGA 112. Reduction in the phase margin of the closed loop can be compensated by using the divider block 302. The divider block 302 inputs are connected to the open loop control port 204 of FIG. 2 or hybrid control port 304 of FIG. 3, and the closed loop error signal 218 of FIG. 2, and output is connected to the input of the integrator 220. If the open loop gain is increased by the VGA 112, then the gain of the closed loop will be compensated back to a nominal value due to the presence of the divider block 302. The divider block 302 does so by reducing the gain of the closed loop by a factor equal to the additional increase in open loop gain provided by the VGA 112 operated in open loop mode.

In addition, as explained in FIG. 2, the same gain is to be provided to the open loop control port 204 and the closed loop control port 216, otherwise the closed loop control regulates out the open loop gain adjustment. Therefore, the closed loop regulates in an offset manner, i.e. "offset" to the main gain step produced by open loop gain control. Due to the VGA 112 operating in open loop controls the nominal output power step and that the closed loop regulates out gain error produced by this open loop step, the overall function may be referred to as a "Hybrid-Closed-Loop."

For a well controlled transient behavior of the VOUT signal 118, it is preferred to match transient responses at both inputs of the subtraction block 214 so that the error signal 218 is only a function of gain error of the VGA 112.

In one implementation, the transient response at the closed loop control port 216 matches the transient response of the path from the open loop control input to the output of the ADC 212. This prevents the closed loop from working against the open loop gain control set via VGA 112. For this, a filter 210-2 is introduced before the closed loop control port 216 and the subtraction block 214. This connects the open loop control port 204 and the closed loop control port 216 forming a hybrid control port 304. Filter 210-2 matches the transfer function of the path from open loop control port 204 in FIG. 2 or hybrid control port 304 in FIG. 3, through VGA 112, coupler 206, detector 208, filter 210-1 and ADC 212. It is to be noted that the bandwidth of the HPCL 114 is smaller than the bandwidth of the filter 210-1, which ensures stability of the loop. The filter 210-1 is normally the most element of the transfer function path described above, and therefore the filter 210-2 will be similar to the filter 210-1, with possibly some additional delay required in filter 210-2.

Exemplary Method

The order in which the method below is described is not intended to be construed as a limitation, and any number of the described method blocks can be combined in any order to implement the methods, or an alternate method. Additionally, individual blocks may be deleted from the method without departing from the spirit and scope of the subject matter described herein.

The method introduced may, but need not, be implemented at least partially in architecture(s) such as shown in FIGS. 1-3. In addition, it is to be appreciated that certain acts in the method need not be performed in the order described, may be modified, and/or may be omitted entirely. Furthermore, the method can be implemented in any suitable hardware, software, firmware, or a combination thereof, without departing from the scope of the invention.

Figure 4:
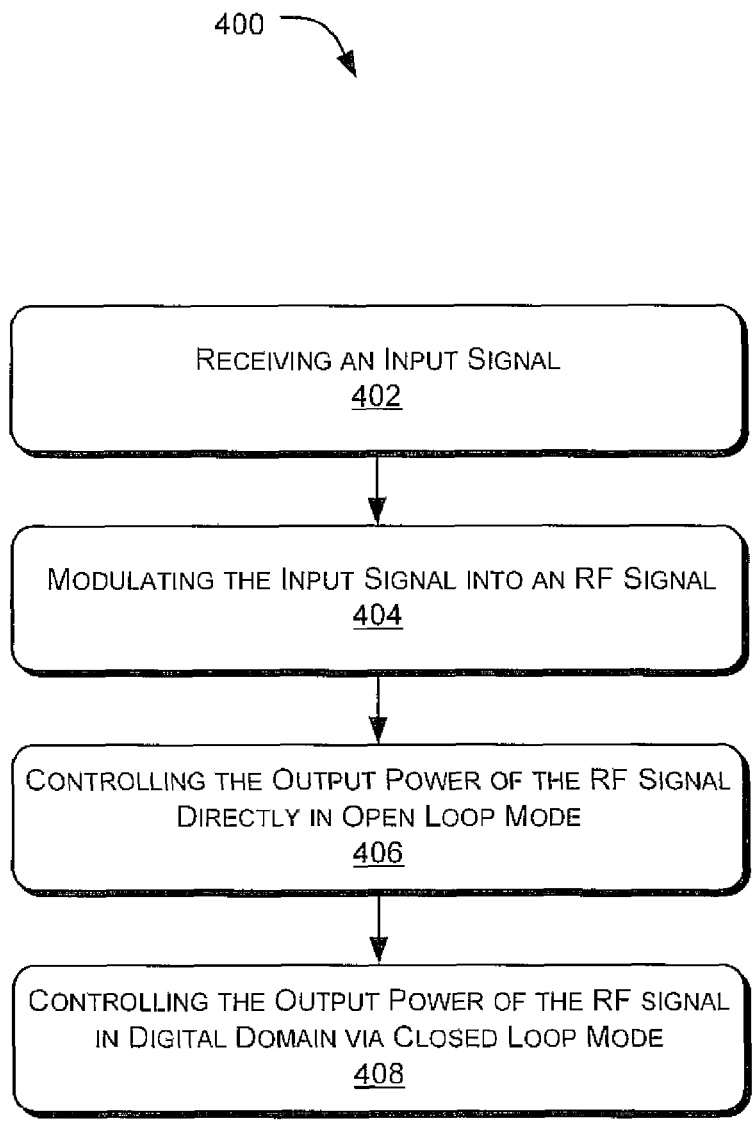
FIG. 4 is a flowchart illustrating an exemplary method for hybrid closed loop power control in a communication device.

FIG. 4 is a flowchart illustrating an exemplary method for hybrid closed loop power control in a communication device.

At block 402, an input signal is received at a transmitter of the communication device, such as a cell phone. In one implementation, the received signal, such as $V_{IN}$ signal 102, can be an analog baseband signal that may correspond to any data including voice, text, and/or audio-video data. The $V_{IN}$ signal 102 can be first processed at the pre-amplifier and buffer 104 and then sent to a modulator.

At block 404, the input signal is modulated into an RF signal. In one implementation, the modulator 106, which may be an RF modulator, converts the amplified signal into the $V_{RF}$ signal 108 and conditions the amplified signal to be capable of being transmitted through free space. Thereafter, the output power of the $V_{RF}$ signal 108 is controlled via both open loop as well as closed loop modes.

At block 406, output power of the RF signal is controlled directly in the open loop mode. In an implementation, the output power of the VRF signal 108 can be controlled by adjusting the gain of the VGA 112 by, for example, applying a reference signal to the VGA 112 through the open loop control port 204. As the gain adjustment provided via the open loop mode is analog and therefore can be coarse, it can suffer from step errors and non-linearity. For fine gain adjustment and accurate power control, the closed loop control is provided.

At block 408, a closed loop control is provided in the digital domain. In one implementation, the VOUT signal 118 is fed back into the HPCL 114 to provide a reference for closed loop control. In the HPCL 114, the VOUT signal 118 is converted into a corresponding digital signal. The digital signal is fed to the subtraction block 214 where it is subtracted from a target value applied at the closed loop control port 214 to generate the error signal 218. The error signal 218 is then integrated and multiplied with the VRF signal 108 to provide fine and regulated gain adjustment. The digital control signal is converted into an analog control signal to control the VGA 112 for fine adjustment and thus providing an accurate power control. In an alternate implementation, the open loop control port and closed loop control port are connected together to form the hybrid control port 304.

CONCLUSION

Although embodiments for a transmitter with hybrid closed loop power control has been described in language specific to structural features and/or methods, it is to be understood that the appended claims are not necessarily limited to the specific features or methods described. Rather, the specific features and methods are disclosed as exemplary implementations for the transmitter with hybrid closed loop power control.

What is claimed is:

1. A transmitter in a communication device comprising:
   a pre-amplifier and buffer that amplifies a voltage input signal,
   a modulator that converts the amplified signal into a radio frequency-modulated signal;
   a variable gain amplifier (VGA) that controls an output power of the radio frequency-modulated signal, wherein the output power is adjusted by adjusting a gain of the VGA in accordance with a hybrid power control loop that includes open loop mode control and closed loop control;
   a multiplier that controls the output power of the radio frequency-modulated signal, wherein the output power is adjusted by adjusting a gain of the multiplier in accordance with the hybrid power control loop that includes open loop mode control and closed loop control; and
   a single hybrid control port from which output power of the transmitter is controlled using both open and closed loop modes.

2. The transmitter of claim 1, wherein the pre-amplifier and buffer provide an electrical impedance transformation to the voltage input signal before any further processing.

3. The transmitter of claim 1, wherein in the open loop control mode, a coarse gain adjustment is made in the VGA to control the output power of the radio frequency-modulated signal.

4. The transmitter of claim 1, wherein in the closed loop control mode, a fine gain adjustment is made in the multiplier by an integrated error signal to control the output power of the radio frequency-modulated signal.

5. The transmitter of claim 1, wherein the closed loop control mode operates in digital domain, and regulates errors including non-linearity and step inaccuracy.

6. The transmitter of claim 1, wherein depending on gain of the VGA, the output power of the radio frequency-modulated signal is scaled up or scaled down.

7. The transmitter of claim 1 further comprising a power amplifier that amplifies and increases the power efficiency of the radio frequency-modulated signal, and produces an output voltage signal.

8. The transmitter of claim 7, wherein the output voltage signal is feedback to the hybrid power control loop and provides gain control.

9. A transmitter with hybrid closed loop power control comprising:
 a multiplier that multiplies a received radio frequency-modulated signal with an integrated error signal representing regulated gain;
 a digital to analog converter that receives and coverts a digital output signal to an analog signal;
 a variable gain amplifier (VGA) that controls output power of the analog signal by adjusting the gain of the VGA by a reference value applied to an open loop control mode of the hybrid closed loop power control, and provides an adjusted analog output signal;
 a filter that removes noise and unwanted components from the adjusted analog output signal, and provides a filtered analog signal;
 an analog to digital converter that converts the filtered analog signal into a digital signal;
 a subtraction block that compares the digital measurement signal with a target signal at a closed loop control node of the hybrid closed loop power control, and generates an error signal; and
 an integrator that integrates the error signal and provides an integrated gain signal to the multiplier.

10. The transmitter of claim 9, wherein the open loop control mode provides for coarse adjustment.

11. The transmitter of claim 9, wherein the target signal is equal to the reference value.

12. The transmitter of claim 9, wherein the integrated signal is multiplied with the radio frequency-modulated signal to generate an amplified signal.

13. The transmitter of claim 9, wherein the hybrid closed loop power control operates in digital domain in a closed loop mode.

14. The transmitter of claim 9, wherein a change in gain and phase margin of the hybrid closed loop power control are directly proportional to a change in open loop gain of the VGA.

15. The transmitter of claim 9, wherein transient response at the closed loop reference node matches transient response of a path from an open control loop node to an output of the analog to digital converter in the hybrid closed loop feedback path.

16. The transmitter of claim 9 further comprising a coupler that feeds back the adjusted analog output signal to the hybrid closed loop power control.

17. The transmitter of claim 9 further comprising a detector that detects an envelope of the hybrid closed loop power control.

18. A method for power control comprising:
 receiving an input signal;
 modulating the input signal into a radio frequency (RF) signal;
 controlling an output power of the RF signal by adjusting a gain of a variable gain amplifier and a gain of a multiplier in accordance with a hybrid power control loop that includes an open loop mode and a closed loop control, and wherein adjusting the gain of the variable gain amplifier and the multiplier is performed using a single hybrid control port.

19. The method of claim 18, wherein the controlling the output power of the RF signal directly in open loop mode is a coarse gain adjustment.

20. The method of claim 18, wherein controlling the output power comprises adjusting control in closed loop mode for fine gain adjustment, wherein the closed loop mode is in the digital domain.

* * * * *